US006557664B1

(12) United States Patent
Andrews et al.

(10) Patent No.: US 6,557,664 B1
(45) **Date of Patent: *May 6, 2003**

(54) LOUDSPEAKER

(76) Inventors: Anthony John Andrews, Hoyle Farm, Dorkey, Surrey, RH5 4PS (GB); John Newsham, Hoyle Farm, Dorking, Surrey, RH5 4PS (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/199,455

(22) Filed: Feb. 22, 1994

(51) Int. Cl.[7] .................................................. H05K 5/00

(52) U.S. Cl. ....................................... 181/152; 181/192

(58) Field of Search ................................ 181/152, 159, 181/183, 185, 187, 188, 192, 195; 381/156

(56) References Cited

U.S. PATENT DOCUMENTS 3,982,607 A * 9/1976 Evans ........................ 181/152
RE32,183 E * 6/1986 Isaacs ........................ 181/185
4,776,428 A * 10/1988 Belisle ................... 181/152 X
4,836,327 A * 6/1989 Andrews et al. ............ 181/152
4,845,776 A * 7/1989 Bittencourt ............. 381/156 X
4,975,965 A * 12/1990 Adamson .................... 381/156
5,103,482 A * 4/1992 Fabri-Conti ................. 381/156

* cited by examiner

*Primary Examiner*—Khanh Dang
(74) *Attorney, Agent, or Firm*—Andrus, Sceales, Starke & Sawall

(57) ABSTRACT

A loudspeaker is disclosed in which a cone driver operates into one end of an acoustic channel having acoustically closed sides and an acoustically open front. A longitudinally extended member is mounted directly in front of, and in alignment with, the driver, so as to restrict the free space within the channel. The rear of the longitudinally extending member effectively extends within the voice coil former, such that the volume defined between the rear of the longitudinally extending member and the loudspeaker is an annulus. The profile of the longitudinally extending member differs in its vertical and horizontal planes so as to provide a lower acoustic impedance in one plane than in the other.

11 Claims, 5 Drawing Sheets

LOUDSPEAKER

BACKGROUND OF THE INVENTION a) Field of the Invention

This invention relates to equipment for sound reinforcement and reproduction, more specifically, to a loudspeaker.

b) Description of the Prior Art

There has long been a need to reproduce or reinforce speech and music for a variety of applications in public address, instruction and entertainment. This need includes a requirement to reproduce or reinforce programme material having a wide frequency range, and to do so with high fidelity and at substantial volumes. Further, such reproduction or reinforcement must be performed in a wide range of venues, of different sizes and having different acoustic properties, imposing different limitations on the size, number, and possible locations of loudspeaker enclosures. There is generally also the requirement, imposed by such limitations and by economic and other factors, that the desired level of performance be achieved while minimising the total size of the sound system.

In addressing this need, hundreds of different enclosure designs have been developed and produced over more than half a century. As the physics of those transducers in common use make it impractical to reproduce the full range of frequencies both at high power and with high efficiency, virtually all systems divide the full frequency range into two or more bands and employ a different transducer for each. "Compression drivers" are used for reproducing higher frequencies and "cone loudspeakers" for lower frequencies (often of different diameters for different bands). In some cases, each transducer design is packaged in its own enclosure, and the enclosures for the various designs stacked or otherwise assembled at the venue to form a large, full-range, array. In other cases, transducers for several of the frequency bands are integrated in a common enclosure.

The performance of a sound system is a product of not only the transducer designs selected; the particulars of their construction; and the frequency ranges at which they are operated, but by the design and construction of their enclosures. This application is concerned with those enclosures that employ cone loudspeakers, whether discrete or integrated in a common enclosure. While there have been many variations in the design of such enclosures, certain basic approaches account for the vast majority of those in use. Once such approach to enclosure design is the "direct radiator" (also employed for the cone loudspeaker in virtually all "bookshelf" HI-FI speakers); in which the cone loudspeaker is mounted to an opening in one planar side of an enclosure, such that the cone radiates directly into free air. Such enclosures radiate across wide vertical and horizontal angles, and as such, are of value in comparatively small venues in which wide dispersion is desired. They are of limited value in larger venues and outdoors because of the limited efficiency with which they convert a given amount of electrical energy to acoustic energy; lack of projection over distance and, worst of all, because of the amount of mutually destructive interference between the comparatively large number of enclosures required to produce a given sound pressure level.

Another approach to enclosure design is "horn loading". The cone loudspeaker operates into one end of a channel having acoustically-closed sides and progressively increasing cross-sectional area towards an acoustically-open front end.

One advantage of such an approach can be an improvement in the efficiency with which electrical energy is converted by a given loudspeaker into acoustical energy (relative to the same loudspeaker in a direct radiator enclosure).

The second is a tighter dispersion or higher "Q" that allows directing the acoustic output towards the listener. These advantages permit horn-loaded loudspeakers to achieve a desired sound pressure level at the listener in larger venues using a smaller number of loudspeakers with less mutual interference. This is offset to some extent by undesirable colouration that has been responsible for the continued use of direct radiator designs in larger venues despite the potential practical advantages of a horn-loaded system. Further, as a result of variations in dispersion for a given horn design over a range of frequencies, horn-loading reduces the range of frequencies a given loudspeaker can reproduce relative to the same loudspeaker in a direct radiator enclosure.

For venues of moderate size and for those portions of large venues (or outdoors) relatively close to the speaker array, there is a need for loudspeaker enclosure of moderately directional character that does not suffer from the known disadvantages of horn-loaded enclosures.

SUMMARY OF THE INVENTION

A loudspeaker enclosure is disclosed in which a member is mounted within an acoustic channel having acoustically-closed sides and an acoustically-open front so as to restrict the free-space within the channel. A loudspeaker is arranged to radiate into the channel. The longitudinally-extending member is mounted directly in front of, and in alignment with, the loudspeaker.

Preferably the rear of the longitudinally-extending member effectively extends to at least the surface of the dust excluder within the voice coil diameter, such that the volume defined between the rear of the longitudinally-extending member and the loudspeaker is an annulus and, preferably, that this extension fixes the distance between the two surfaces.

The profile of the longitudinally-extending member is non-circularly symmetric; the width of the member decreasing along its length in one plane, and remaining substantially similar in the other, decreasing rapidly in width at the front. The channel is similar in this respect, and, in combination with the member, presents a lower acoustic impedance in one plane than in the other. The surface of the channel include regions in which the rate at which the surface diverges from the central axis abruptly increases. The point at which this increase occurs changes with position within the channel.

The disclosed enclosure provides the desired degree of projection and dispersion, controlled by the shapes of the member and channel in combination. The efficiency of the enclosure is at least as good as horn-loading but the undesirable colouration is avoided and phase coherance is markedly improved. Both the frequency range over which and the highest frequency at which a given loudspeaker can be used are improved, from which flow other advantages.

BRIEF DESCRIPTION OF THE DRAWINGS

A specific embodiment of the invention will now be described by way of example with reference to the accompanying drawing in which.

DESCRIPTION OF A PREFERRED EMBODIMENT

Figure 1:
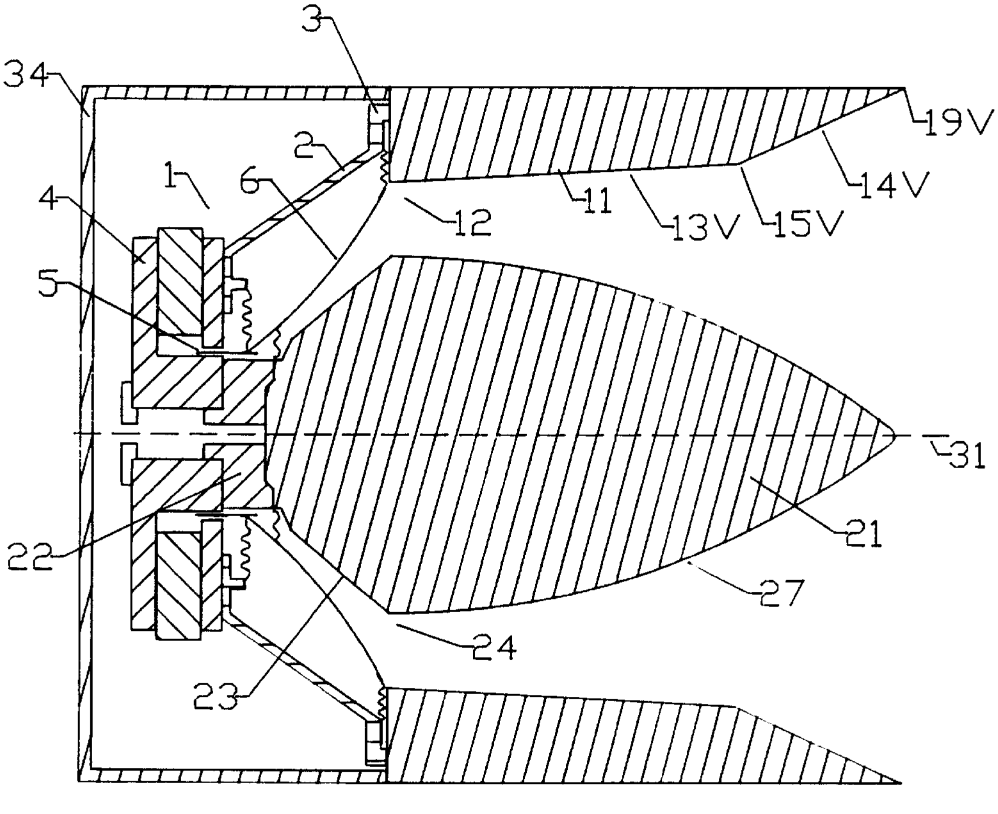
FIG. 1 is a section through the enclosure in one plane.

FIG. 1 shows a section through an enclosure constituting an embodiment of the present invention. Cone loudspeaker 1 is of conventional construction and any desired size. It includes a magnet 4 mounted to a cast or formed frame 2, whose periphery 3 is typically bolted or clamped to the enclosure or to one of its internal members or components. A voice coil is wound on a rigid, cylindrical form 5 and the application of the amplified audio signal causes corresponding excursions of the voice coil form 5 along the longitudinal axis 31. An acoustically opaque "cone" 6 is attached to the voice coil form 5 at its centre and (via a resilient "surround") to the frame 2 at its periphery 3, such that the longitudinal motion of the voice coil form causes similar motion of the cone.

The cone loudspeaker is mounted in alignment with the opening 12 at the rear end of the channel 11 formed by acoustically closed sides 13. Preferably, the opening 12 is of similar diameter to the cone, rather than the maximum diameter of the surround.

Methods of fabricating such a channel and of mounting cone loudspeakers are well known. The cone loudspeaker 1 is acoustically enclosed in the known manner by enclosure 34.

A longitudinally-extending member 21 is mounted in alignment with the longitudinally-extending axis 31 of the acoustic channel 11. Member 21 is supported in its position by any suitable means. Projections extending from the member to the channel are possible, and if used, preferably have a streamlined shape. The rear surface 23 of member 21 is spaced away from the loudspeaker cone 6, by a distance substantially in excess of the maximum displacement of cone 6 in response to the audio signal. The distance between cone 6 and rear surface 23 may increase in the direction extending from the centre towards the periphery of the cone. The rear surface 23 of member 21, at least for acoustic purposes, extends substantially within the diameter of voice coil form 5, such that the volume defined between the rear surface 23 and cone 6 forms an annulus. Many methods of doing so without interfering with the motion of cone 6 are possible. One such method is a generally cylindrical extension 22 (integral or assembled) to the rear of member 21 having a diameter smaller than the inner diameter of voice coil form 5. Preferably, this extension is fixed by some suitable means to the loudspeaker frame or magnet assembly, with the advantage that the desired spacing between the rear surface of the member and the cone are produced automatically and respectably by the act of their assembly (such fixing does not preclude additional attachments or guides connecting the member with the channel or some other structure). Other methods of achieving the desired acoustic affect, supporting and spacing the member are also possible.

Figure 2:
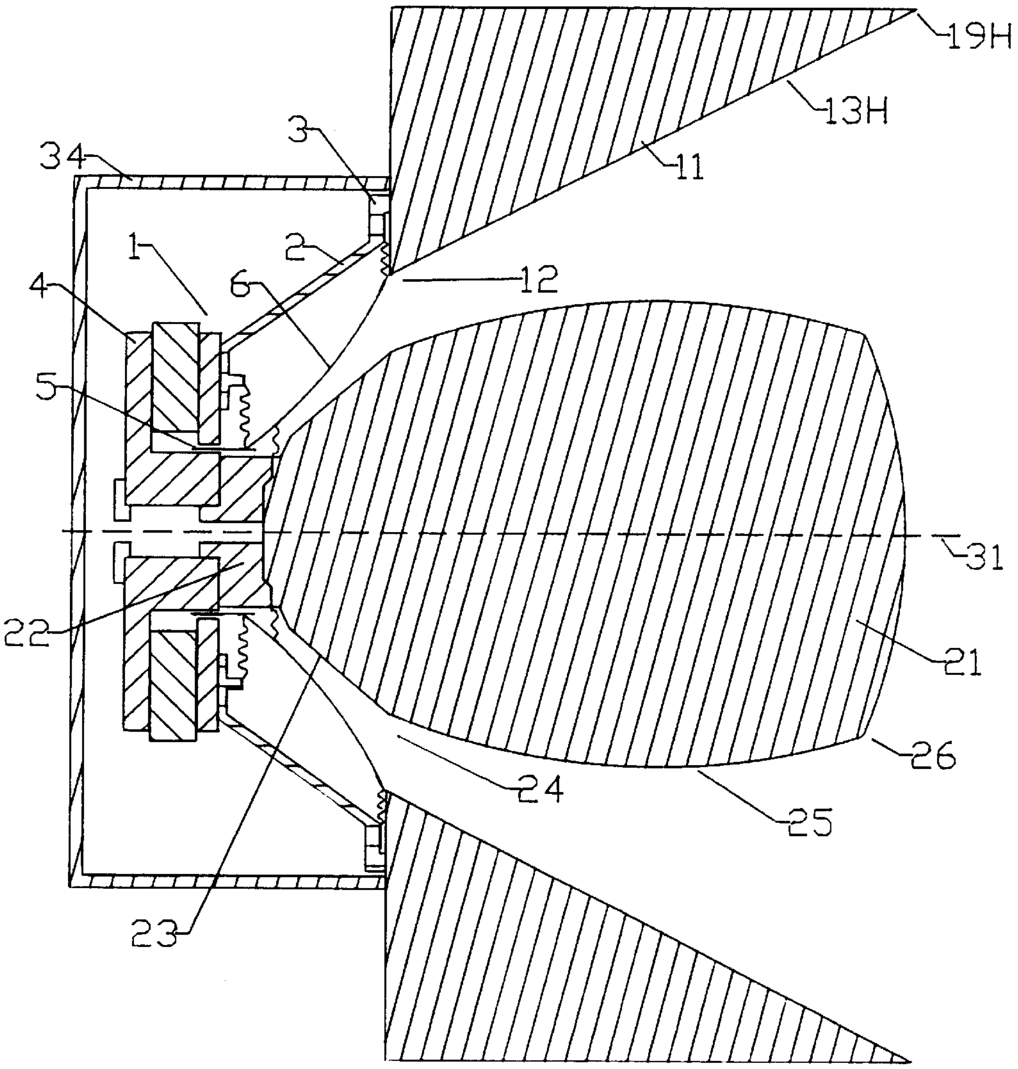
FIG. 2 is a section through the enclosure in a second plane perpendicular to that of FIG. 1.
Figure 5:
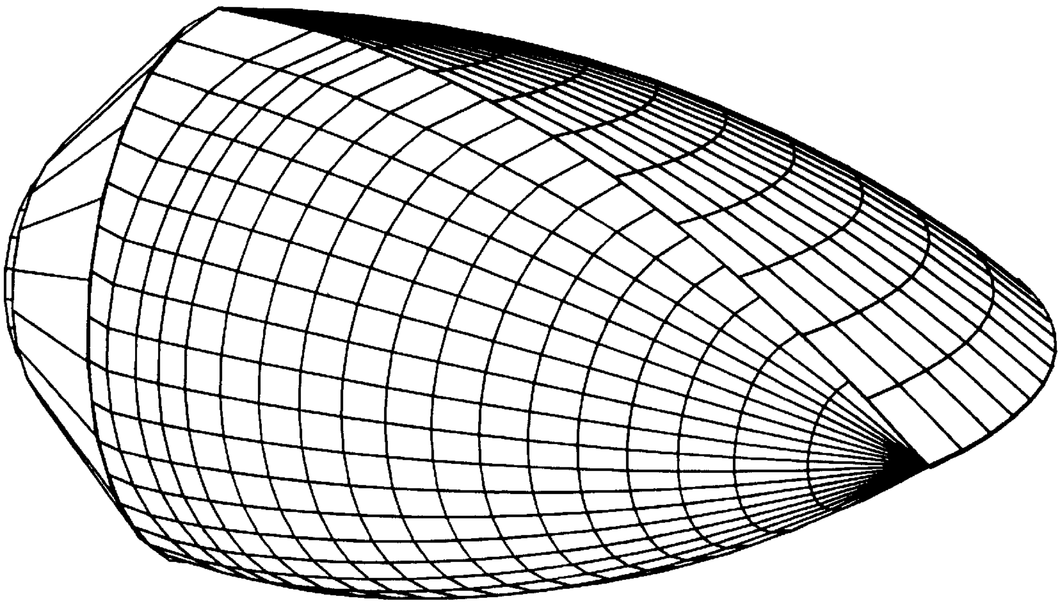
FIG. 5 shows in perspective the member removed from the enclosure.

Comparing FIG. 1 with FIG. 2 (a cross section rotated 90 degrees about axis 31), it will be seen that both central member 21 and the surfaces of the channel 11 differ. As will be seen in FIG. 1 in one plane, the member transitions at 24 from the outward taper generally following the cone surface 6 to a progressively increasing inward taper along surface 27 to a point. Examining FIG. 2, it will be seen that in the other plane, the outward taper of rear surface 23 to transition 24 is followed by a region 25 of substantially less taper than the other plane (indeed substantially no taper in this embodiment). In this plane, member 21 finally tapers abruptly at 26. As is seen most clearly in FIG. 5, a view of member 21 removed from the enclosure, the result is a shape at the forward end of member 21 generally resembling an axe-head.

Comparison of FIG. 1 with FIG. 2 also illustrates the variation between the vertical and horizontal planes of channel 11. Examining the volumes defined between the surfaces of the member 21 and the channel 11 it will be seen that they differ markedly in their development. A higher acoustic impedance is presented by the volumes illustrated in FIG. 1 versus those of FIG. 2.

Figure 3:
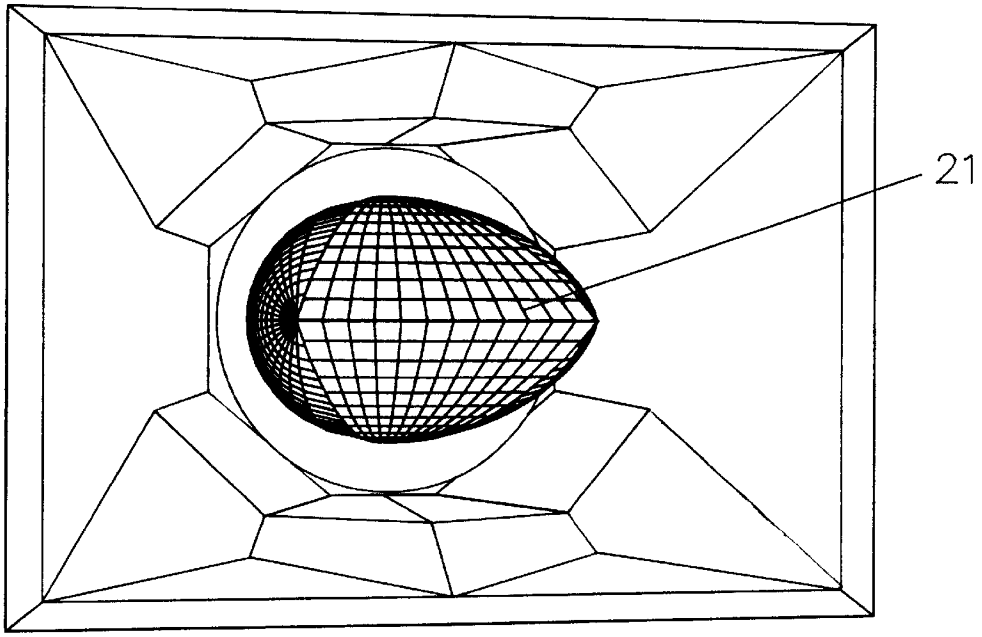
FIG. 3 is a front perspective view of the enclosure assembled.
Figure 4:
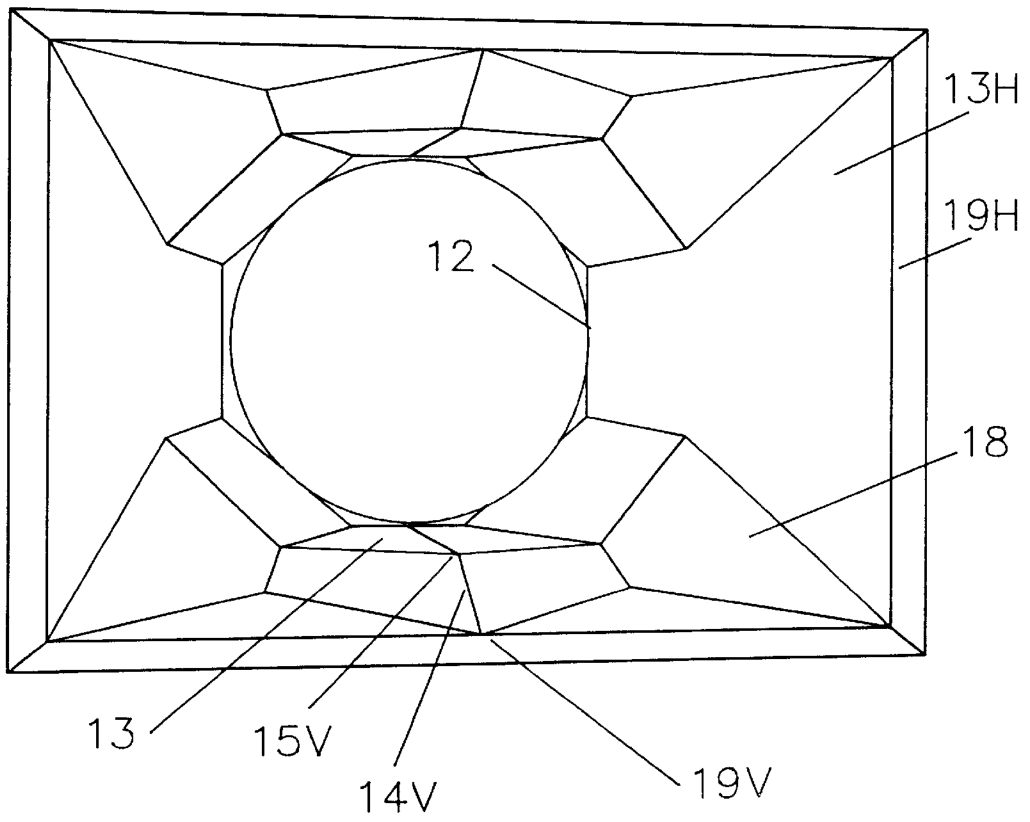
FIG. 4 is a front perspective view of the enclosure with the member and the cone loudspeaker removed, showing the interior surface of the channel.

FIG. 3 and, in particular FIG. 4 illustrate other desirable features of channel 11. It will be seen that in the illustrated embodiment, along the plane corresponding to and illustrated in FIGS. 1, 3 and 4, the surface of channel 11 also incorporates a transition 15V from a first surface 13V having one taper, to a second surface 14V having a higher rate. Preferably, and as is best illustrated in FIG. 4, the distance from the rear end 12 of the channel 11 at which this transition takes place is not constant. It will be seen that form 18 fillets the corner of channel 11.

It will be understood that variations are possible in the design and construction of embodiments within the scope of the invention. In only one example, the ratio of relative length to width can be altered. One cabinet design by the applicants incorporates two cone loudspeakers of different diameters. To time-align the two loudspeakers without the use of an electronic delay, the enclosure for the smaller loudspeaker is "stretched" along axis 31 such that the distance between points 3 and 19V is substantially the same for both enclosures, such that the corresponding points are aligned. Other variations will be apparent.

What is claimed is:

1. A loudspeaker assembly comprising:

an enclosure, the enclosure having an acoustically open end, an acoustically closed end, and acoustically closed sides extending generally along a longitudinal axis;

an acoustically opaque cone, the cone having a center, a surface, and a periphery, and the cone being coupled to the acoustically closed end;

an elongated member, the member extending along the longitudinal axis and the closed sides to form an acoustic channel;

the member having a rear surface, the rear surface coupled to the closed end, the member further having a first front surface, a second front surface, the rear surface spaced from the cone by a distance substantially in excess of the maximum displacement of the cone in response to an audio signal, the rear surface extending substantially within the diameter of the cone such that a volume defined between the rear surface and the cone forms an annulus, wherein the member extends along the longitudinal axis in a first plane and in a second plane, the second plane being perpendicular to the first plane, in the first plane and in the second plane, the rear surface tapers outward along the longitudinal axis generally following the surface of the cone to a transition, and the first front surface tapers progressively inward along the longitudinal axis from the transition toward the open end, and in the second plane, the second front surface tapers progressively inward along the longitudinal axis from the transition toward the open end, wherein the second front surface in the second plane tapers inward at a lesser degree than the first front surface in the first plane, wherein the acoustic channel has different shapes in said first and second planes.

2. The loudspeaker assembly of claim 1 wherein the second front surface in the second plane initially tapers outward and then transitions to taper inward.

3. The loudspeaker assembly of claim 1 wherein the channel comprises a side transition from a first surface tapering away from the member to a second surface tapering away from the member at a greater degree than the first surface.

4. The loudspeaker assembly of claim 3 wherein the side transition varies in the direction of the longitudinal axis.

5. The loudspeaker assembly of claim 1 wherein a surface form fillets corner portions of the channel.

6. A loudspeaker assembly comprising:

an enclosure, the enclosure having an acoustically open end, an acoustically closed end, and a plurality of acoustically closed sides extending generally along a longitudinal axis;

an electroacoustic transducer attached to the enclosure adjacent the closed end and having a frustoconical diaphragm which has an axis coaxial with said longitudinal axis;

a single elongated member extending along the longitudinal axis and the closed sides to form therewith an acoustic channel;

the member having a rear surface, and a front portion including opposite first front surfaces and opposite second front surfaces, the rear surface spaced from the frustoconical diaphragm and extending substantially within the diameter of the diaphragm such that a volume defined between the rear surface and the diaphragm forms an annulus, wherein, in a first plane including said longitudinal axis and extending through said first front surfaces, the front portion, the closed sides and the acoustic channel have first cross-sectional shapes and, in a second plane including said longitudinal axis, perpendicular to said first plane and extending through said second front surfaces, the front portion, the closed sides and the acoustic channel have second cross-sectional shapes different from said first cross-sectional shapes.

7. The loudspeaker assembly of claim 6 wherein in the first plane, the first front surfaces taper progressively inward along the longitudinal axis toward the open end, and in the second plane, the second front surfaces taper progressively inward along the longitudinal axis toward the open end, wherein the second front surfaces taper inward at a lesser degree than the first front surfaces.

8. The loudspeaker assembly of claim 7 wherein the second front surfaces initially taper outward and then transition to taper inward.

9. The loudspeaker assembly of claim 8 wherein the channel comprises a side transition from a first surface tapering away from the member to a second surface tapering away from the member at a greater degree than the first surface.

10. The loudspeaker assembly of claim 9 wherein the side transition varies in the direction of the longitudinal axis.

11. The loudspeaker assembly of claim 7 wherein a surface form fillets corner portions of the channel.

* * * * *